(12) United States Patent
Hietala et al.

(10) Patent No.: US 8,193,859 B1
(45) Date of Patent: Jun. 5, 2012

(54) DUAL FET DETECTOR

(75) Inventors: Alexander Wayne Hietala, Phoenix, AZ (US); Jeffery Peter Ortiz, Chandler, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 42 days.

(21) Appl. No.: 12/882,313

(22) Filed: Sep. 15, 2010

Related U.S. Application Data (60) Provisional application No. 61/246,416, filed on Sep. 28, 2009.

(51) Int. Cl.
*H03G 3/20* (2006.01)
(52) U.S. Cl. ......................................................... 330/140
(58) Field of Classification Search .................. 330/140; 329/365, 366; 455/115.3
See application file for complete search history.

(56) References Cited

U.S. PATENT DOCUMENTS

| | | | | |
|---|---|---|---|---|
| 6,571,087 | B1 * | 5/2003 | Iwatsuki | 455/127.1 |
| 7,164,315 | B2 * | 1/2007 | Camnitz et al. | 330/140 |
| 7,809,087 | B2 * | 10/2010 | Filipovic | 375/317 |

OTHER PUBLICATIONS

Valdes-Garcia, A. et al., "A Broadband CMOS Amplitude Detector for On-Chip RF Measurements," IEEE Transactions on Instrumentation and Measurement, Jul. 2008, pp. 1470-1477, vol. 57, No. 7, IEEE.

* cited by examiner

*Primary Examiner* — Steven J Mottola
(74) *Attorney, Agent, or Firm* — Withrow & Terranova, P.L.L.C.

(57) ABSTRACT

A dual FET detector having a common RF input and a common detector output for two detector circuits is provided. The first detector circuit is optimized for detecting lower RF signal levels while the second detector circuit is optimized for detecting higher RF signal levels. A detector output voltage output from the common detector output is a composite signal made up of the individual contributions of the two detector circuits. A control circuit receives a feedback signal derived from the detector output voltage, and uses the feedback signal to control a transition between urging a predominance of the contribution to the detector output voltage from one of the detector circuits to the other. The control of the transition between the detector circuits ensures that whichever of the two detector circuits is best optimized for a particular RF signal level will contribute the most to the detector output voltage.

20 Claims, 11 Drawing Sheets

DUAL FET DETECTOR

RELATED APPLICATIONS

This application claims the benefit of provisional patent application Ser. No. 61/246,416, filed Sep. 28, 2009, the disclosure of which is hereby incorporated herein by reference in its entirety.

FIELD OF THE DISCLOSURE

The present disclosure relates to sensing power output from a power amplifier (PA) in a transmitter. In particular, the present disclosure relates to a linear detector that is implemented in a complementary metal oxide semiconductor (CMOS) circuit, and that senses the power output with improved sensitivity over a relatively large PA output power range.

BACKGROUND

In order to control power output by a power amplifier (PA), most conventional transmitters have a PA control loop, which is a feedback loop that incorporates a detector to measure the power proximate to an antenna of the transmitter. Specifically, most conventional transmitters measure the power levels between the PA and the antenna. The measurement of the output power is used to adjust the gain of the PA so that the PA outputs the desired output power based on the measurement of the output power.

Logarithmic detectors are currently used in the PA control loops of some transmitters. While logarithmic detectors have acceptable dynamic range, they also have undesirable characteristics such as relatively high current drain, large die area, high cost, and low stability at low power levels. In contrast, a linear detector is relatively less sensitive at low power than a logarithmic detector. However, computer simulations of linear detectors incorporated in PA control loops used in conventional transmitters make clear that currently existing linear detectors do not have enough dynamic range to be useful over all desirable output power levels. Thus, there remains a need for a detector circuit having a relatively large dynamic range that is comparable to that of logarithmic detectors, while also having increased sensitivity at low power levels.

SUMMARY

The present disclosure provides a detector circuit having a relatively large dynamic range that is comparable to that of logarithmic detectors, while also having increased sensitivity at low power levels. In general, the detector circuit of the present disclosure is a dual field effect transistor (FET) detector that is realized using complementary metal oxide semiconductor (CMOS) technology.

In particular, the present disclosure provides a dual FET detector having a common radio frequency (RF) input and a common detector output for a first detector circuit and a second detector circuit that detect an RF signal that is input into the common RF input. The first detector circuit is an active FET detector that is optimized for detecting relatively lower RF signal levels, while the second detector circuit is a basic FET detector that is passive and optimized for detecting relatively higher RF signal levels. A detector output voltage output from the common detector output is a composite signal made up of the individual contributions of the first detector circuit and the second detector circuit. A control circuit receives a feedback signal derived from the detector output voltage, and uses the feedback signal to control a continuous transition between urging a predominance of the contribution to the detector output voltage from one of the two detector circuits to the other. The control of the transition between the two detector circuits ensures that whichever of the two detector circuits is best optimized for a particular RF signal level will contribute the most to the composition of the detector output voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
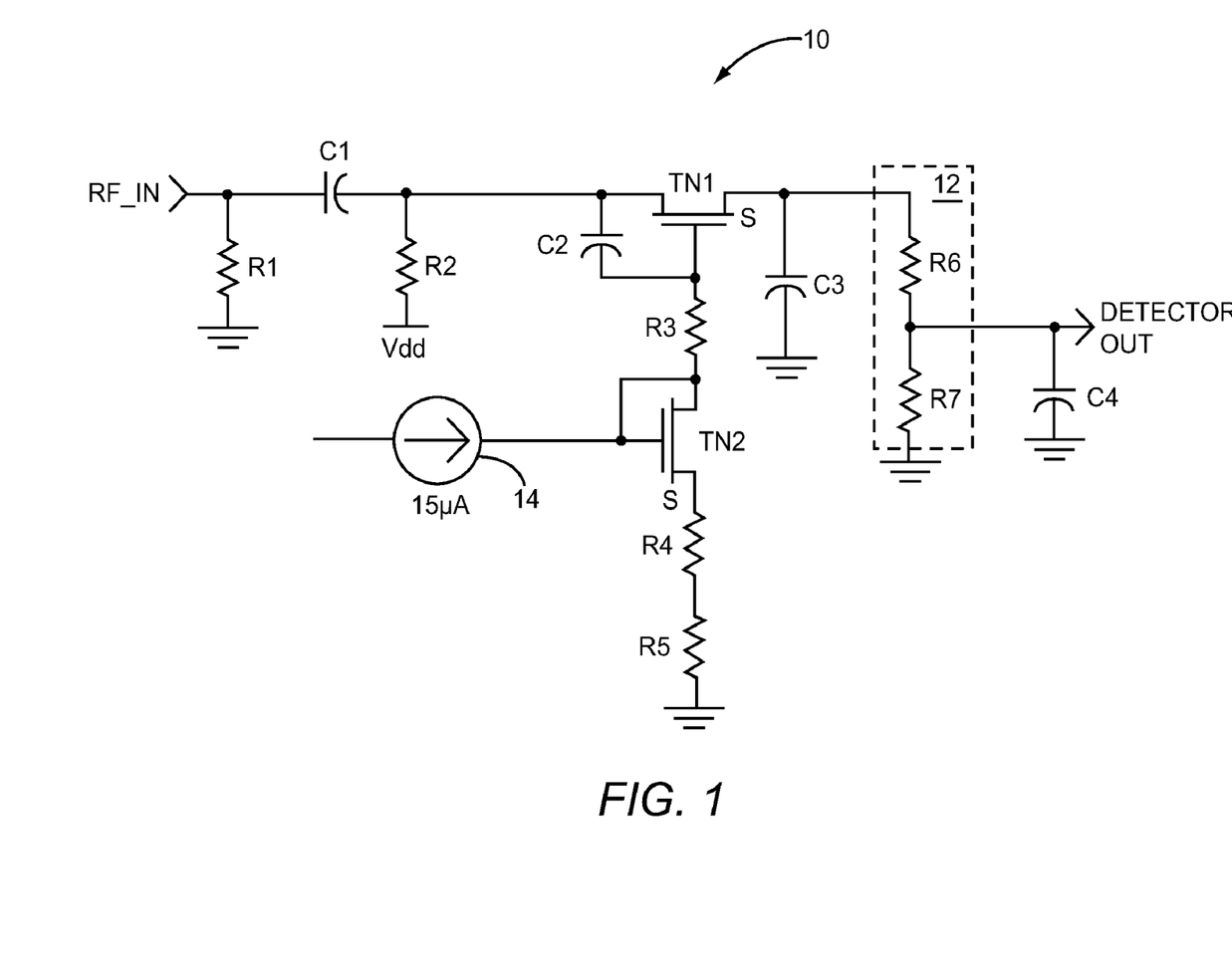
FIG. 1 is a circuit diagram for a basic field effect transistor (FET) detector.

FIG. 1 depicts a basic field effect transistor (FET) detector 10 having a FET TN1 that receives a radio frequency (RF)

signal through an RF input RF_IN that is coupled to the drain of the FET TN1 by way of a capacitor C1. A resistor R1 provides impedance matching for an RF signal source such as a directional coupler port (not shown). The RF signal coupled through the capacitor C1 is then coupled from the drain of the FET TN1 into the gate of the FET TN1 by a capacitor C2. When the RF signal rises to positive values, the gate-to-source voltage ($V_{GS}$) of the FET TN1 will increase. As the $V_{GS}$ increases, the FET TN1 conducts current that passes through a resistor R2 from a supply voltage ($V_{dd}$). The current continues to flow into a capacitor C3 that is coupled between the source of the FET TN1 and a fixed voltage node, which in this case is ground. A voltage divider 12 coupled between the source of the FET TN1 and ground is made up of a resistor R6 and a resistor R7 and is placed in parallel with the capacitor C3. A capacitor C4 coupled in parallel with the resistor R7 functions as a voltage peak sampler for the RF signal. The capacitor C3 and the capacitor C4 charge as current flows from the FET TN1 into the voltage divider 12.

As the RF signal transitions to negative values, the $V_{GS}$ across the FET TN1 becomes negative, which results in the FET TN1 becoming non-conducting or turning off. In this way, the FET TN1 functions as a diode that conducts current into the capacitor C4 on positive voltage swings of the RF signal and a block to current that would normally discharge capacitor C4 during negative swings of the RF signal. An output signal (DETECTOR OUT) available at a positive terminal of the capacitor C4 provides a time varying RF peak detection voltage that is usable by a power amplifier (PA) control circuit (not shown) to control the output power level of a PA providing the RF signal.

A FET TN2 is usable to mirror a biasing current through the FET TN1. Both the FET TN1 and the FET TN2 are of the negative channel field effect transistor (NFET) type and are practically physically identical. A precision current that is fed into the drain of the FET TN2 via a band gap-type current source 14 establishes a biasing current, which in this case is around 15 μA. The biasing current places the FET TN1 close to the point of conduction so that the FET TN1 will be ready to conduct the moment the RF signal swings positive. The readiness for conduction increases the RF detection sensitivity of the basic FET detector 10.

The gate and drain of the FET TN2 are coupled together so that the FET TN2 functions as a diode. A resistor R4 coupled to the source of the FET TN2 matches the resistance value of the resistor R6, and a resistor R5 coupled between the resistor R4 and ground matches the resistance value of the resistor R7. As a result of the matching resistance values, a value of $V_{GS}$ established for the FET TN2 will also be established with the same value for the $V_{GS}$ of the FET TN1. A resistor R3 coupled between the gate of the FET TN1 and the drain of the FET TN2 draws no significant direct current (DC). Therefore, a gate to ground DC voltage of the FET TN1 will be the same as the gate to ground DC voltage of the FET TN2. Thus, the currents flowing separately in the FET TN1 and the FET TN2 will have an identical value. As such, a DC offset voltage across the resistor R7 will be the same value as the DC voltage across the resistor R5. Since the DC current flowing through the resistor R7 is derived from the mirroring of the current flowing from the band gap-type current source 14, the DC offset voltage across the resistor R7 is very stable with regard to temperature drifts and $V_{dd}$ fluctuations. Moreover, the DC offset voltage across the resistor R7 is very beneficial in that an output signal of zero volts is to be avoided. Further still, having an established DC current flowing through the FET TN1 ensures that a threshold voltage for the $V_{GS}$ of the FET TN1 has been met. As a result, the basic FET detector 10 can detect smaller-amplitude RF signals than would be possible without the biasing current.

Figure 2:
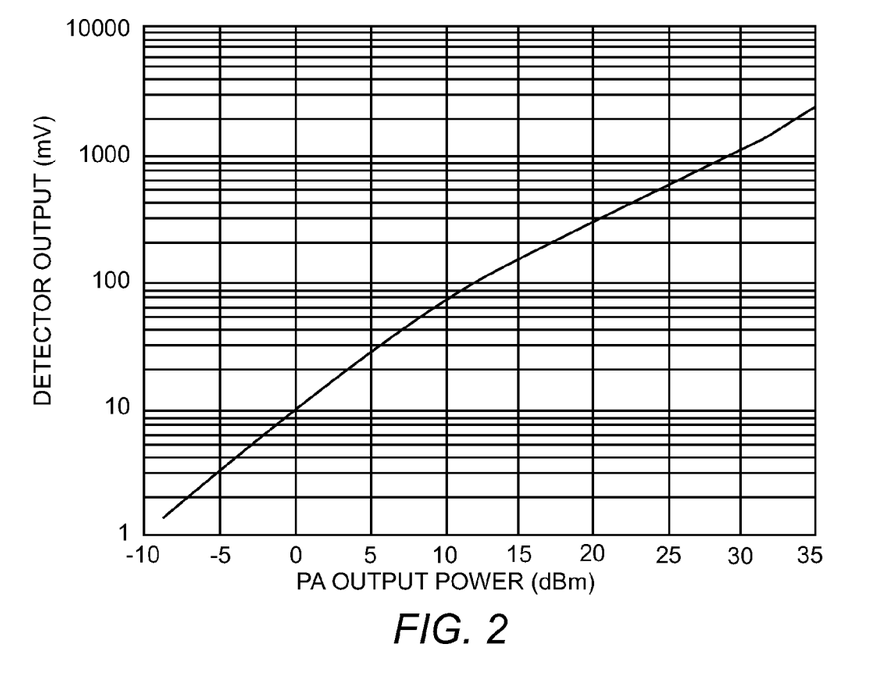
FIG. 2 is a graph depicting detector output voltage versus power amplifier (PA) power for operation of the basic FET detector at a low band frequency.

FIG. 2 is a graph depicting detector output voltage versus PA power for operation of the basic FET detector 10 at a low band frequency of 836 MHz.

The dynamic range for the basic FET detector 10 is about 32 dB for the detector output voltage, which ranges from about 10 mV to about 2V. There is minimal variation in the performance of the basic FET detector 10 over temperature ranging from about −35° C. to 85° C. There is also no significant variation in the detector output voltage over a $V_{dd}$ range from 2.8V to 3.6V.

Figure 3:
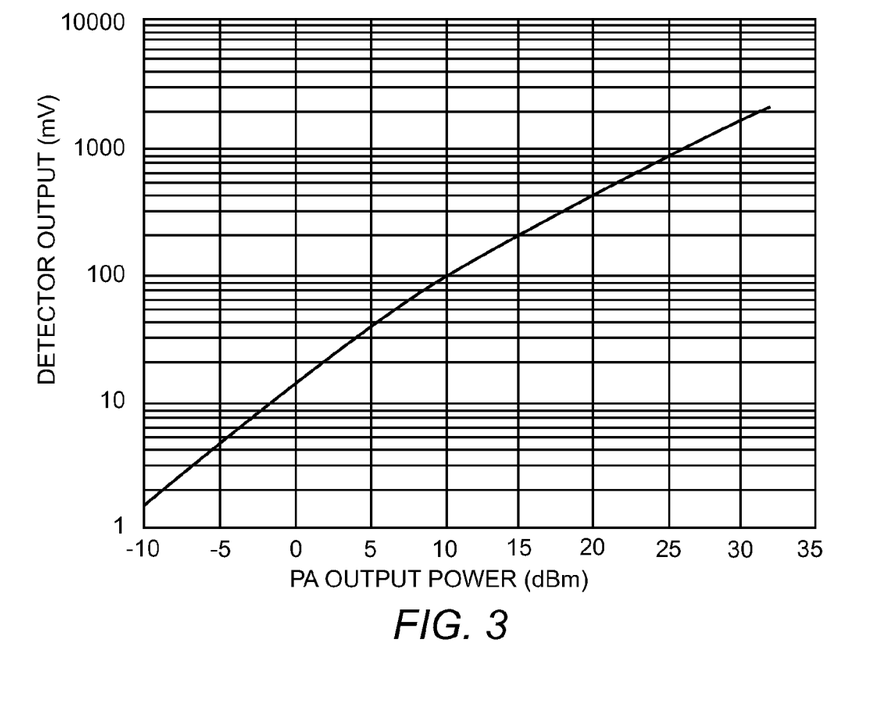
FIG. 3 is a graph depicting detector output voltage versus PA power for operation of the basic FET detector at a high band frequency.

FIG. 3 is a graph depicting detector output voltage versus PA power for operation of the basic FET detector 10 at a high band frequency of 1880 MHz. The performance in the high bands is much like that in the lower bands. However, the minimum output power for a PA is 0 dBm for the high bands. Therefore, the pedestal level for a PA control voltage ($V_{RAMP}$) needs to be controlled at a level of about −5 dBm. Problematically, the basic FET detector 10 can only provide about 5 mV of detector output voltage for a power level of −5 dBm. As a result of this deficiency, an accurate pedestal level for precharging a PA control loop cannot be met. It is important to note that this deficiency is not a result of reduced sensitivity at higher frequencies. Instead, the deficiency results from the minimum output power being lower by 5 dB in the high bands. Moreover, the basic FET detector 10 has insufficient dynamic range to accommodate a power level that may be as low as −5 dBm.

Figure 4:
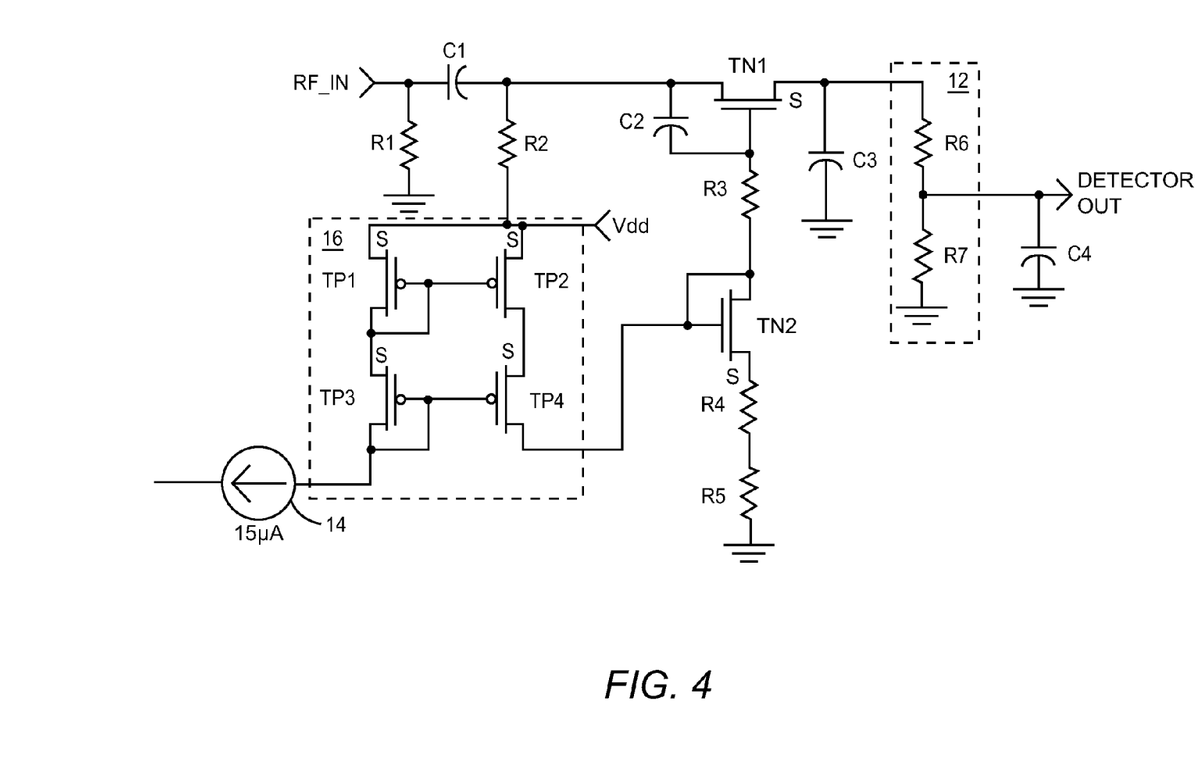
FIG. 4 is a circuit diagram depicting modifications to the basic FET detector.

Turning now to FIG. 4, the basic FET detector 10 is modified by adding a cascode current mirror 16 made up of FETs TP1, TP2, TP3, and TP4, each of which is a positive channel field effect transistor (PFET). In this case, the current source 14 functions as a current sink to pull a band-gap-generated current through the FET TP1 and the FET TP3. Both the FET TP1 and the FET TP3 are configured to function in a diode mode by having their respective drains coupled to their respective gates. The FET TP2 and the FET TP4 are configured as a buffer that mirrors the current that flows through the FET TP1 and the FET TP3. The drain of the FET TP4 is coupled to the gate of the FET TN2. In this way, a precise and stable biasing current is fed into the drain of the FET TP2 in the same manner as in the basic FET detector 10 shown in FIG. 1. Therefore, adding the cascode current mirror 16 does not alter the operation of the basic FET detector 10.

Figure 5:
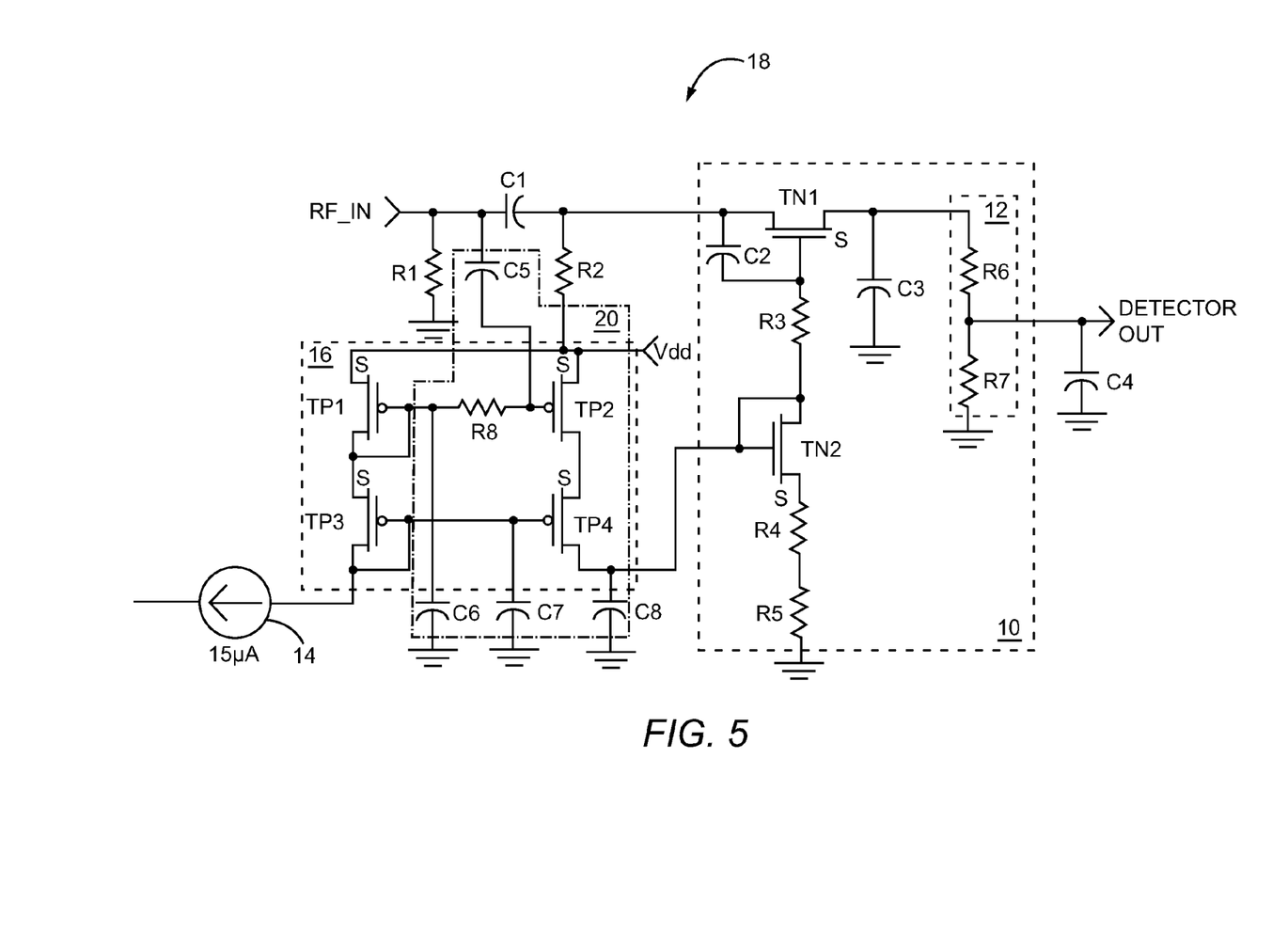
FIG. 5 is a circuit diagram of a proto dual FET detector circuit that integrates an active FET detector with the basic FET detector.

FIG. 5 depicts a proto dual FET detector circuit 18 that adds modifications for configuring an active FET detector 20. By design, the addition of the cascode current mirror 16 allows for other modifications that configure the active FET detector 20 that detects RF signals in conjunction with the basic FET detector 10. A capacitor C5 coupled between the RF input RF_IN and the gate of the FET TP2 applies a portion of an RF signal present at the RF input RF_IN across a resistor R8 that is coupled between the gate of the FET TP1 and the gate of the FET TP2. A capacitor C6 coupled between the gate of the FET TP1 and ground provides an alternating current (AC) ground for the side of the resistor R8 coupled to the gate of the FET TP1. Moreover, the resistor R8, the capacitor C6, and a capacitor C7 coupled between the gate of the FET TP4 and ground further serve to decouple the RF signal from the DC biasing. A capacitor C8 coupled to the drain of the FET TP4 and the gate of the FET TN2 is also coupled to ground to filter a half wave rectified waveform resulting from the turning off of the FET TP2 and the FET TP4 during positive swings of the RF signal.

An AC gate-to-source voltage ($V_{gs}$) for the FET TP2 equals the AC voltage developed across the resistor R8 in response to the RF signal. In this way, the FET TP2 will conduct current during the negative swings of the RF signal. The current conducted through the FET TP2 also flows through the FET TP4, which is driving current into the drain of the FET TN2. In response to the current flowing into the drain of the FET TN2, the FET TN1 will conduct current that is made available from $V_{dd}$ through the resistor R2. The current flowing through the FET TN1 charges the capacitor C4 to provide the output signal DETECTOR OUT. Notice that the configuration of the proto dual FET detector circuit 18 retains the basic FET detector 10, while adding the active FET detector 20 that is based upon the FET TP2.

Figure 6:
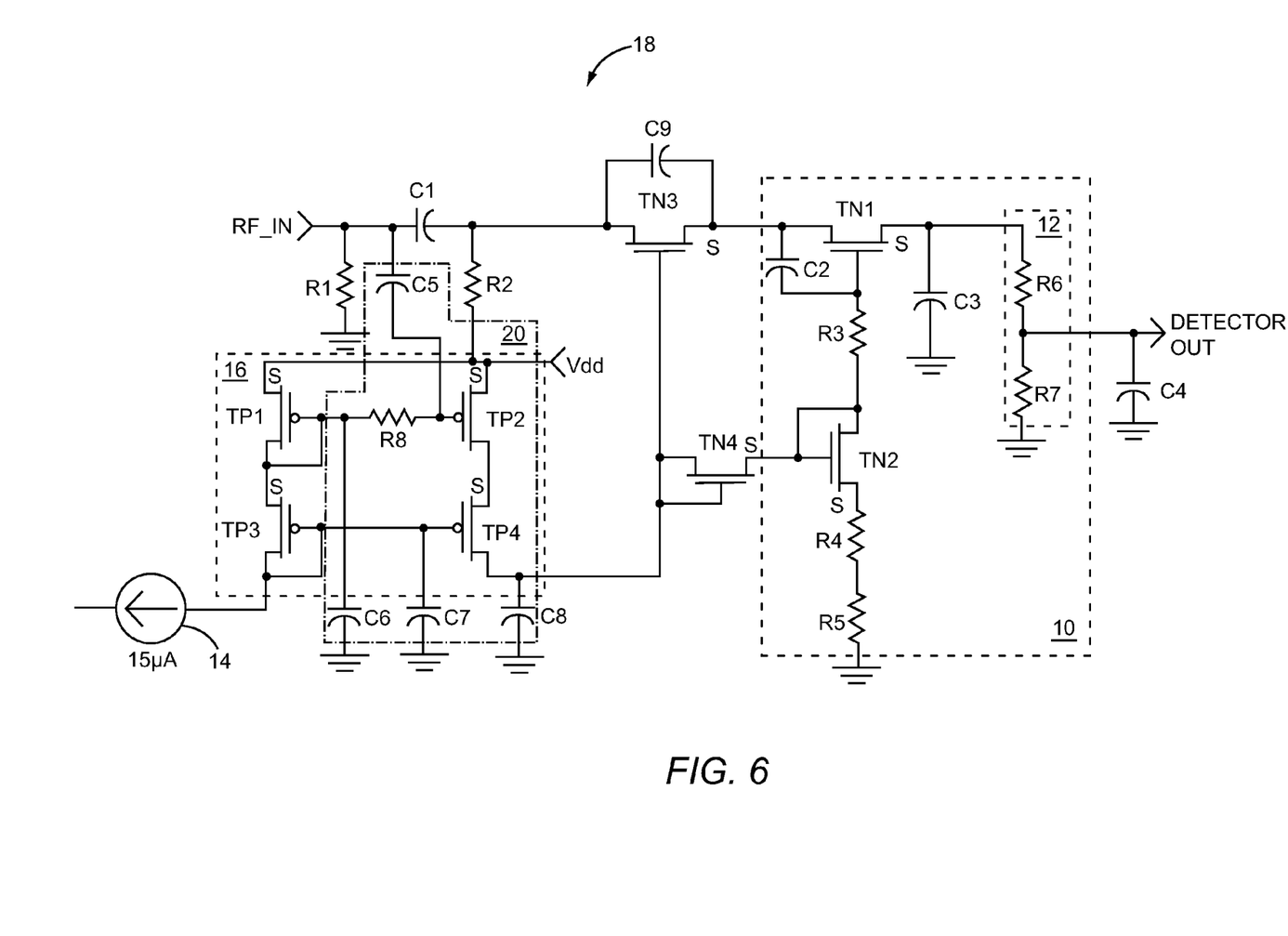
FIG. 6 is a circuit diagram of the proto dual FET detector circuit illustrated in FIG. 5 including cascode buffers.

Turning now to FIG. 6, a FET TN3 and a FET TN4 are added to the proto dual FET detector circuit 18 in order to ensure stable drain voltages for the FET TN1 and the FET TN2 as the voltage level of $V_{dd}$ varies due to battery voltage fluctuations, etc. The drain of the FET TN3 is coupled to the RF input RF_IN through the capacitor C1, and the source of the FET TN3 is coupled to the drain of the FET TN1. The gate of the FET TN3 is coupled to the drain of the FET TP4. A capacitor C9 is coupled across the FET TN3 from drain to source to route RF signals around the FET TN3. The FET TN4 is coupled in cascode with the FET TN2. In particular, the gate of the FET TN2 is coupled to the source of the FET TN4. The gate and drain of the FET TN4 are both coupled together to place the FET TN4 into a diode mode. In operation, the FET TN3 functions as a buffer for the FET TN1, whereas the FET TN4 functions as a buffer for the FET TN2.

Figure 7:
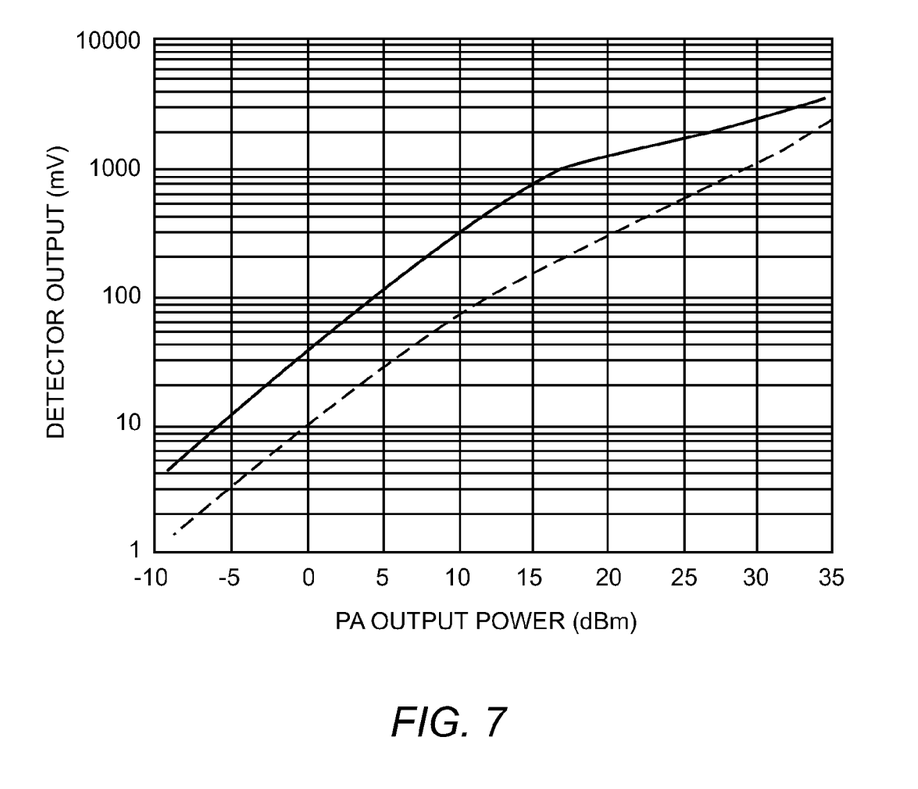
FIG. 7 is a graph depicting detector output voltage versus PA power for operation of the proto dual FET detector circuit at a low band frequency.

FIG. 7 is a graph depicting detector output voltage versus PA power for operation of the proto dual FET detector circuit 18 at a low band frequency of 836 MHz. The lower dashed curve represents the detector output voltage versus PA power for the basic FET detector 10 (FIG. 6). The upper solid curve represents the output voltage versus PA power for the active FET detector 20 (FIG. 6). As designed, the active FET detector 20 improves sensitivity at low levels over the basic FET detector 10 by about 6 dB. Notice that at about +15 dBm, the active FET detector 20 runs out of voltage headroom. A decrease in slope for the detector output voltage versus PA output power occurs in this particular case at about +15 dBm. However, a breakpoint of PA output power level at which the slope decreases for the detector output voltage versus PA output power is dependent upon the voltage level of $V_{dd}$. In addition, at very high power levels of operation, the output detector voltage can exceed 3V, which is well outside of the operating range of CMOS circuitry.

Figure 8:
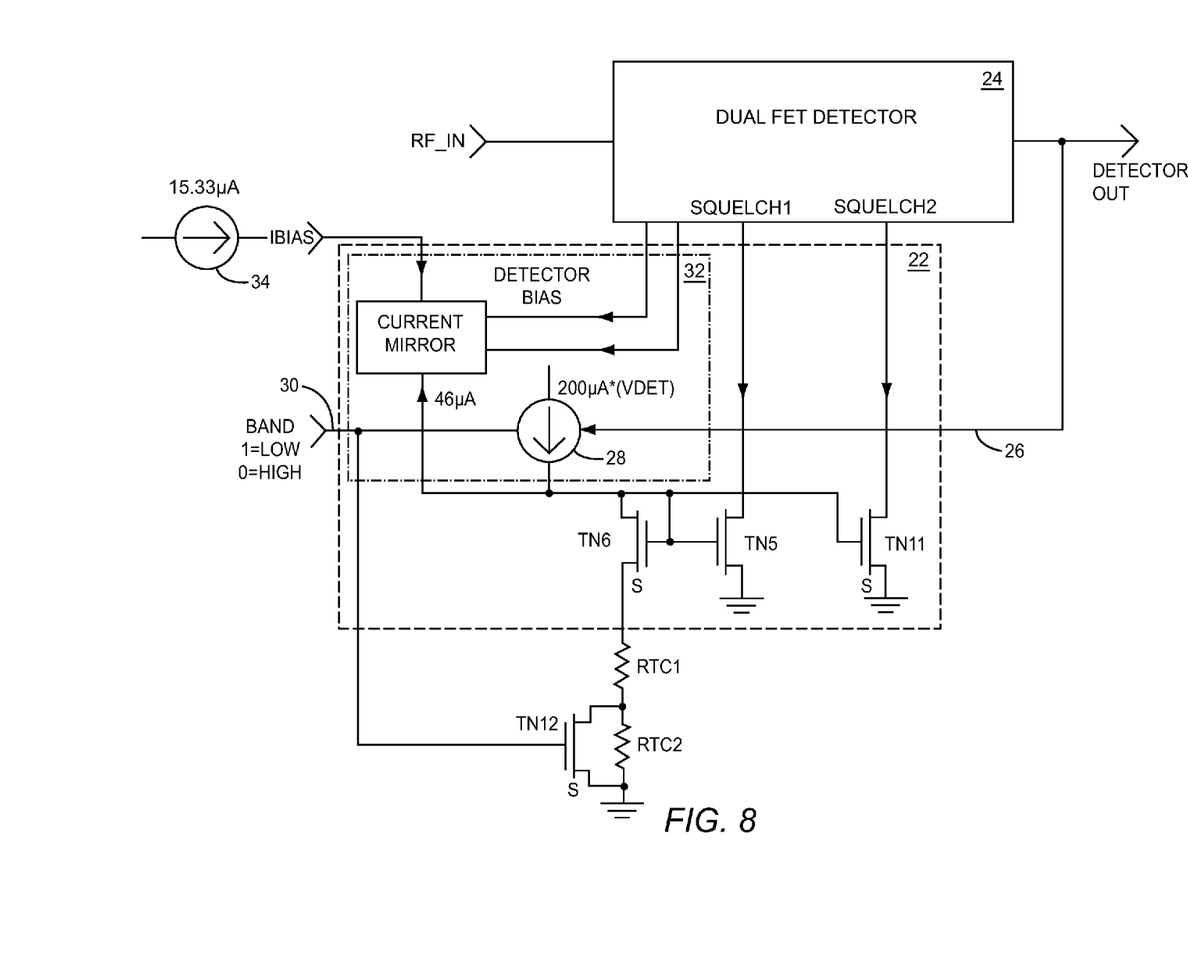
FIG. 8 is a circuit diagram of a control circuit for a dual FET detector that is based upon the proto dual FET detector circuit of FIG. 6.

FIG. 8 depicts a control circuit 22 for a dual FET detector 24 that is a modified version of the proto dual FET detector circuit 18 (FIG. 6). A detector output voltage available at the common detector output DETECTOR OUT is a composite signal made up of the individual contributions of the basic FET detector 10 and the active FET detector 20. The control circuit 22 controls a transition between urging a predominance of the contribution to the detector output voltage from the basic FET detector 10 to the active FET detector 20, and vice versa. The active FET detector 20 is the major contributor to the detector output voltage at relatively low RF signal levels. However, as the RF signal level increases, the control circuit 22 urges a transition to occur in which the basic FET detector 10 provides an increasing contribution of detector output voltage to the DETECTOR OUT signal. At some point during the transition urged by the control circuit 22, the RF signal reaches a level at which the basic FET detector 10 becomes the major contributor to the DETECTOR OUT signal.

The control circuit 22 uses a voltage VDET provided by a feedback signal 26 to control the transitioning of detector output voltage contributions between the active FET detector 20 and the basic FET detector 10. The feedback signal 26 adjusts a current source 28 that drives the gate of a FET TN5, the gate of a FET TN6, and the gate of a FET TN11. Preferably, the output current from the current source equals around 200 µA per volt times the voltage VDET. The source of the FET TN5 is coupled to ground, whereas the drain of the FET TN5 is coupled to a first control point (SQUELCH1) inside the dual FET detector 24. Similarly, the source of the FET TN11 is coupled to ground, and the drain is coupled to a second control point (SQUELCH2) that is also inside the dual FET detector 24. Both SQUELCH1 and SQUELCH2 are used by the control circuit 22 to adjust the detector output voltage contribution of the active FET detector 20. The control circuit 22 does not control the basic FET detector 10.

Generally speaking, as the level of the RF signal at the RF input RF_IN rises, the control circuit 22 drains current from the current of the active FET detector 20 in order to decrease the detector output voltage contribution of the active FET detector 20. In particular, the current source 28 drives current into the drain of the FET TN6. The drain and the gate of the FET TN6 are coupled together so that the FET TN6 operates in a diode mode. Moreover, the gate of the FET TN5 is coupled to the gate of the FET TN6, and the gate of the FET TN11 is coupled to the gate of the FET TN6. In this configuration, the FET TN6 provides a reference that urges equal currents to flow through both the FET TN5 and the FET TN11. A FET TN12, a resistor RTC1, and a resistor RTC2 provide temperature compensation for the control circuit 22. The resistor RTC1 is coupled between the source of the FET TN6 and the drain of the FET TN12. The resistor RTC2 is coupled between the drain of the FET TN12 and the source of the FET TN12. The source of the FET TN12 is connected to ground. The gate of the FET TN12 is coupled to an RF band selection input 30 that is also coupled to a control input of the current source 28. The current source 28 includes a temperature compensation adjustment for both low band and high band operation. The FET TN12 can be activated and deactivated via the RF band selection input 30. A logic one signifying a low band selection activates a low band temperature compensation for the current source 28 by driving the FET TN12 to conduct current through the resistor RTC1 and the FET TN12. In contrast, a logic zero representing a high band selection selects a high band temperature compensation for the current source 28 by deactivating the FET TN12. A current mirror sub-block 32 provides bias currents to the active FET detector 20 (FIG. 20). The current mirror sub-block 32 receives a temperature compensated reference current IBIAS from a current source 34.

Figure 9:
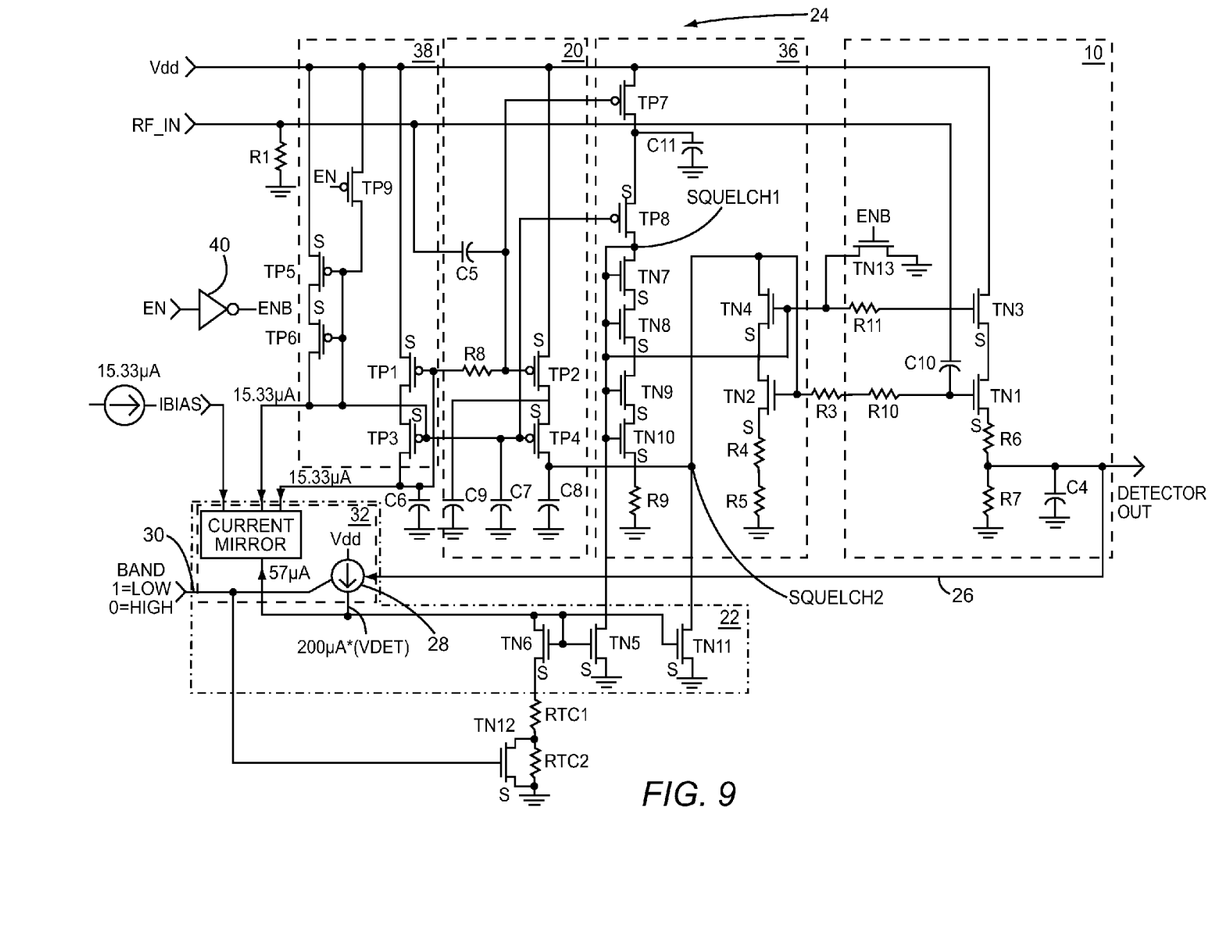
FIG. 9 is a circuit diagram that provides details for the dual FET detector shown as a sub-block in FIG. 8.

The dual FET detector 24 is shown in detail in FIG. 9. Notice that unlike the proto dual FET detector circuit 18 of FIG. 6, an RF signal at RF_IN is coupled directly to the gate of the FET TN1 with a capacitor C10. The current source 28 responds to the feedback signal 26 by adjusting the current driving the FET TN5 and the FET TN11. Notice that the drain of the FET TN11 is coupled to the drain of the FET TP4, which is the SQUELCH2 point. The coupling of the drains of the FET TP4 and the FET TN11 allows the control circuit 22 to adjust the current flowing to the FET TN4, which in turn adjusts the current driving the FET TN1.

As an RF signal coupled to the gate of the FET TP2 swings negatively, the FET TP2 increasingly conducts current. The current conducted through the FET TP2 is also conducted through the FET TP4 to drive the drain of the FET TN4. The current flowing through the FET TN4 and the FET TN2 is mirrored through the FET TN1 to charge the capacitor C4. As the capacitor C4 is charged from contributions of current from both the active FET detector 20 and the basic FET detector 10, the feedback signal 26 urges the current source 28 to increase the current conducted through the FET TN11. The current conducted through the FET TN11 lessens the amount of current available to drive the FET TN2, which in turn reduces the amount of current driving the FET TN1. As such, the contribution to the detector output voltage by the active FET detector 20 decreases as the level of the RF signal being detected increases. At a relatively high RF signal level, the FET TN11 will be driven by enough current from the current source 28 that the contribution to the detector output voltage by the active FET detector 20 will be practically zero. In other words, at a relatively high RF signal level, the detector output voltage will practically comprise only a contribution of voltage coming from the charging of the capacitor C4 via the basic FET detector 10. Conversely, as the RF signal decreases to a relatively low level, the feedback received by the current source 28 will be relatively small. Therefore, the current driving the gate of the FET TN11 will be relatively small, which results in only a small amount of current being taken from the current available to drive the FET TN1. Consequently, the contribution to the detector output voltage coming from the active FET detector 20 will dominate the composition of the detector output voltage at relatively low RF levels.

A FET TP7 and a FET TP8, along with a FET TN7, a FET TN8, a FET TN9, and a FET TN10 comprise an NFET biasing block 36. The FET TP7 and the FET TP8 are both PFETs, while the FET TN8, the FET TN9, the FET TN10 and the FET TN11 are NFETs. The gate of the FET TP7 is coupled to the gate of the FET TP2, and the gate of the FET TP8 is coupled to the gate of the FET TP4. The FET TP7 and the FET TP8 are configured in a cascode configuration similar to the cascode configuration of the FET TP2 and the FET TP4. The FET TP7 and the FET TP8 duplicate the active FET detector 20 made up of the FET TP2 and the FET TP4. A capacitor C11 coupled between the gate of the FET TP4 and ground serves to decouple the RF signal from the NFET biasing block 36. The drain of the FET TN7 is coupled to the drain of the FET TP8. The FET TN7, the FET TN8, the FET TN9, and the FET TN10 are connected in series from drain to source, respectively. A resistor R9 is coupled between the source of the FET TN10 and ground. The resistance value of R9 matches the resistance value of the series combination of the resistor R4 and the resistor R5. Each of the gates of the FET TN7, the FET TN8, the FET TN9, and the FET TN10 are coupled to the drain of the FET TN5, which is the SQUELCH1 point. The drain and the gate of the FET TN7 are coupled together for diode mode operation. The gate of the FET TN4 is coupled to the drain of the FET TN5, thereby allowing the gate voltage of the FET TN4 to be controlled.

In operation, the NFET biasing block 36 prevents a corruption of the bias current for the FET TN4 and the FET TN2 by maintaining an appropriate gate voltage for the FET TN4. In particular, as the current flowing through the FET TP2 increases, the current flowing through the FET TP7 increases by an equal amount. In turn, this increase in current flowing through the FET TP7 increases the gate voltage of the FET TN4, thereby maintaining appropriate biasing for all RF signal levels.

A PFET bias circuit 38 is included in the dual FET detector 24 to improve the stability of the current mirror provided by the FET TP2 and the FET TP1. The source of the FET TP5 is coupled to $V_{dd}$ and the source of the FET TP6 is coupled to the drain of the FET TP5, whereas the drain of the FET TP6 is coupled to the gate of the FET TP3. The drain of the FET TP6 is also coupled to an input of the current mirror sub-block 32. Both the FET TP5 and the FET TP6 are PFET transistors that are configured to function in a diode mode by having their respective gates coupled to the drain of the FET TP6.

A logic circuit 40 along with a FET TP9 and a FET TN13 is useable to enable or shutdown the dual FET detector 24. The logic circuit 40 receives an enable (EN) signal and outputs an inverse logic signal (ENB) that is coupled to the gates of the FET TP9 and the FET TN13. The source of the FET TP9 is coupled to $V_{dd}$, and the drain of the FET TP9 is coupled to the gate of the FET TP5 and the gate of the FET TP6. Since the FET TP9 is a PFET transistor a current will be conducted through the FET TP9 when the EN signal is at logic low. As a result, the current mirror provided by the FET TP2 and the FET TP1 will be activated when the EN signal is at logic high. In contrast, the current mirror provided by the FET TP2 and the FET TP1 will be shutdown when the EN signal is at a logic low. The drain of the FET TN13 is coupled to the gate of the FET TN4, while the source of the FET TN13 is coupled to a fixed voltage node such as ground. The FET TN13 is a NFET transistor. Therefore, when the ENB signal is at a logic low, the FET TN13 will not conduct current, and the FET TN4 will be under the control of the control circuit 22. In contrast, when the ENB signal is at logic high, the FET TN13 will conduct current away from the gate of the FET TN4, thereby shutting off the FET TN4, which in turn prevents the FET TN2 from mirroring current through the FET TN1.

Figure 10:
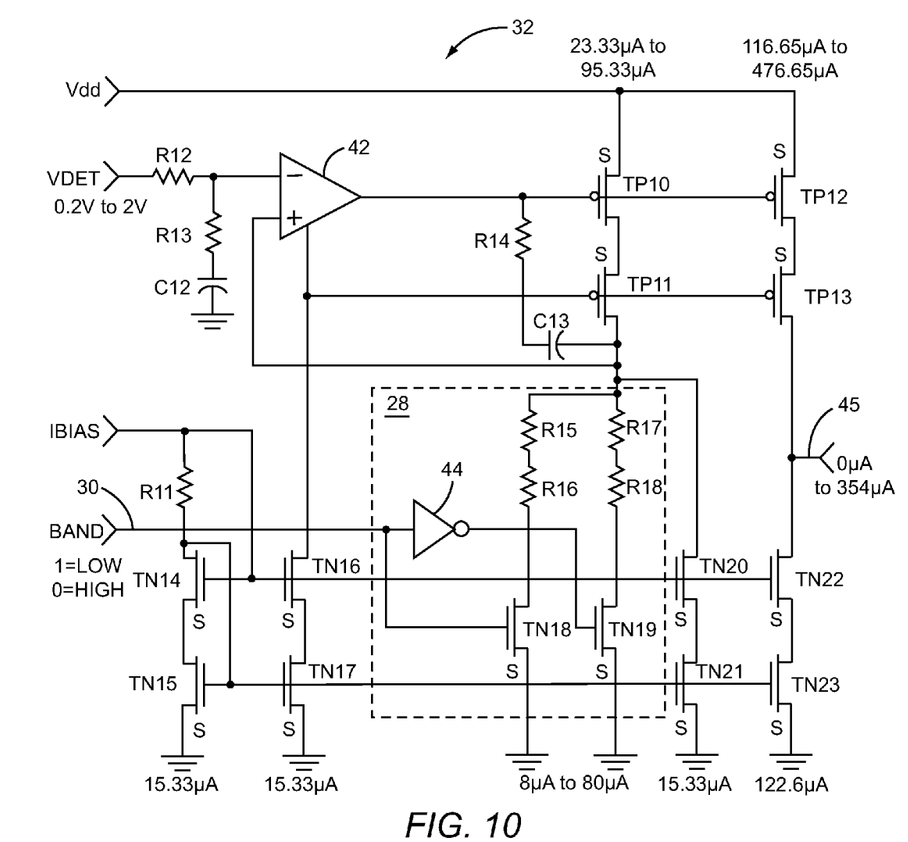
FIG. 10 is a circuit diagram of a current mirror sub-block used to reduce the active FET detector output as the detector output voltage rises.

FIG. 10 is a circuit diagram showing the details of the current mirror sub-block 32 used to reduce the contribution to the detector output voltage by the active FET detector 20 (FIG. 9) as the detector output voltage rises. A resistor R11 receives the IBIAS current for a cascode configured current mirror made up of a FET TN14, a FET TN15, a FET TN16 and a FET TN17, which provides a mirror of the bias current for an operational amplifier 42 as well as a reference for several other bias currents described below.

The operational amplifier 42 receives the voltage VDET provided by the feedback signal 26 (FIG. 9) from DETECTOR OUT. The feedback signal 26 is filtered by a filter made up of a resistor R12, a resistor R13 and a capacitor C12 before the feedback signal 26 enters the inverting input of the operational amplifier 42. The output of the operational amplifier 42 drives the gate of a FET TP10, which is in a cascode configuration with a FET TP11.

A dominant pole set by the resistor R12, the resistor R13 and the capacitor C12 provides stability of a control loop for the control circuit 22 (FIG. 8). A resistor R14 is coupled between the output of the operation amplifier 42 and a first terminal of a capacitor 13. A second terminal of the capacitor C13 is coupled to the drain of the FET TP11, and to the non-inverting input of the operational amplifier 42. A zero formed by the resistor R14 and the capacitor C13 provides stabilization for the operational amplifier 42. A closed loop response of the control circuit 22 has a wide bandwidth that is greater than 10 MHz.

The current source 28 includes a FET TN18 and a FET TN19. The sources of the FET TN18 and the FET TN19 are coupled to a fixed voltage node, which in this case is ground. The FET TN18 is coupled to the drain of the FET TP11 through a resistor R15 coupled in series with a resistor R16. Similarly, the FET TN19 is coupled to the drain of the FET TP11 through a resistor R17 coupled in series with a resistor R18. The resistor R15 and the resistor R17 are both poly type resistors with negative temperature coefficients. The resistor R16 and the resistor R18 are both n-well type resistors with positive temperature coefficients. The negative temperature coefficient of the resistor R15 cancels with the positive temperature coefficient of the resistor R16, so that when current flows through the FET TN18, the current will be compensated for ambient temperature fluctuations. Likewise, the negative temperature coefficient of the resistor R17 cancels with the positive temperature coefficient of the resistor R18 so that when current flows through the FET TN19, the current will be compensated for ambient temperature fluctuations.

The FET TN18 and the FET TN19 do not conduct current at the same time. Instead, the FET TN18 only conducts current during low band operation, while the FET TN19 only conducts current during high band operation. The gate of the FET TN18 and the input of a logic gate inverter 44 are both driven by a band selection signal inputted at the RF band selection input 30. The output of the logic gate inverter 44 drives the gate of the FET TN19 to ensure that the FET TN18 and the FET TN19 are not conducting current simultaneously.

A portion of the output of the operational amplifier 42 is fed back from the drain of the FET TP11 into the non-inverting input of the operational amplifier 42. As a result, the voltage VDET will be dropped across the series combination of the resistor R15 and the resistor R16 when the FET TN18 is conducting. Alternately, the voltage VDET will be dropped across the series combination of the resistor R17 and the resistor R18 when the FET TN19 is conducting. The current flowing through either the FET TN18 or the FET TN19 is equal to the voltage VDET divided by the resistance of either the series combination of the resistor R15 and the resistor R16 or the series combination of the resistor R17 and the resistor R18. A preferred value for the resistance of either the series combination of the resistor R15 and the resistor R16 or the series combination of the resistor R17 and the resistor R18 is 25 kΩ. Therefore, the preferred current flow through either the FET TN18 or the FET TN19 will range from 8 μA to 80 μA for the voltage VDET that ranges from 0.2V to 2V.

A FET TN20 and a FET TN21 conduct a current mirrored from the FET TN15, which in this case is the current IBIAS. The drain of the FET TN20 is coupled to the drain of the FET TP11 so that the operational amplifier 42 is forced to provide an output voltage even if the voltage VDET falls to low levels. In this way, the operational amplifier is ensured to be active when the voltage VDET becomes non-zero.

The total current flowing through the FET TP10 and the FET TP11 equals the current flowing through either the FET TN18 or the FET TN19 plus the current flowing through the FET TN20 and the FET TN21. Therefore, the preferred total current flowing through the FET TP10 and the FET TP11 will range from 8 μA to 80 μA plus the 15 μA flowing through the FET TN20 and the FET TN21.

A FET TP12 and a FET TP13 provide an output current for driving the FET TN5 and the FET TN11 (FIGS. 8 and 9). The FET TP12 and the FET TP13 are both PFET transistors. The source of the FET TP12 is coupled to $V_{dd}$, whereas the drain is coupled to the source of the FET TP13. The drain of the FET TP13 is a current output 45 from which current flows to drive the FET TN5 and the FET TN11.

The gate of the FET TP12 is coupled to the gate of the FET TP10, whereas the gate of the FET TP13 is coupled to the gate of the FET TP11 so that current flowing through the FET TP11 is mirrored through the FET TP12 and the FET TP13. Yet, in this case, the FET TP12 and the FET TP13 each have effectively five times the channel area of either the FET TP10 or the FET TP11. Therefore the current mirrored through the FET TP11 is five times larger. The current flowing through the FET TP12 and the FET TP13 ranges from 116.65 μA to 476.65 μA. However, a current flowing from the current source output 45 with an offset greater than zero is not preferred. Therefore, a current sink made up of a FET TN22 and a FET TN23 is provided to sink enough current to ensure that there is no offset current flowing from the current source output 45 when the VDET voltage is small (e.g., <220 mV).

The drain of the FET TN22 is coupled to the drain of the FET TP13, and the source of the FET TN22 is coupled to the drain of the FET TN23. The source of the FET TN23 is coupled to a fixed voltage node, which in this case is ground. The gate of the FET TN22 is coupled to the gate of TN14, and the gate of the FET TN23 is coupled to the gate of the FET TN15 so that current flowing through the FET TN15 is mirrored through the FET TN22 and the FET TN23. However, in this case, the FET TN22 and the FET TN23 each have effectively eight times the channel area of either the FET TN14 or the FET TN15. Therefore, the current flowing through the FET TN22 and the FET TN23 will be eight times larger than the IBIAS current flowing through the FET TN15. In this case, the current flowing through the FET TN23 is 122.6 μA, which is more than enough current to ensure that there is no offset current flowing from the current source output 45 when the VDET voltage is small (e.g., <220 mV).

Figure 11:
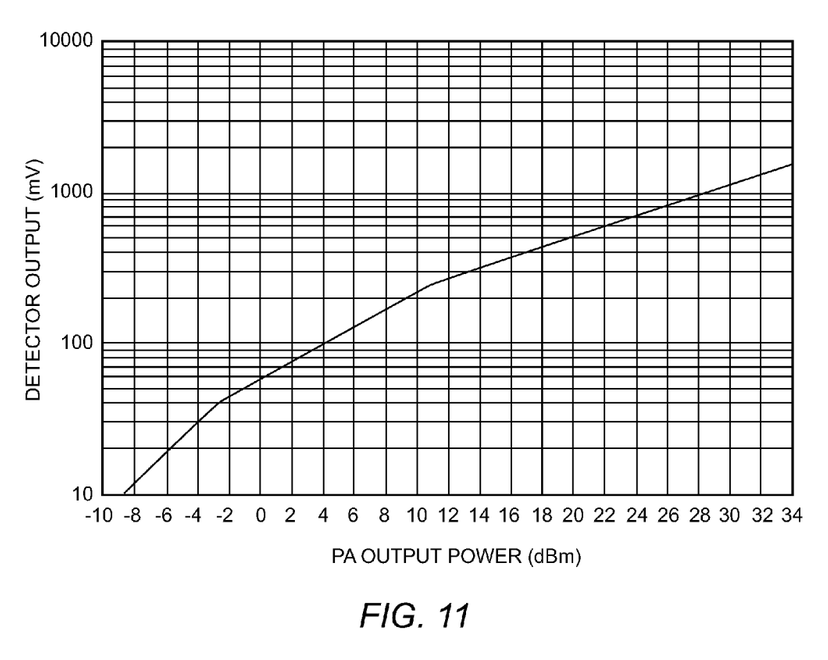
FIG. 11 is a graph depicting detector output voltage versus PA power for operation of the dual FET detector of the present disclosure.

FIG. 11 is a plot of detector output voltage without a DC offset voltage for the dual FET detector 24 (FIG. 9). Note that the detector output voltage is about 20 mV at a PA output power of −5 dBm. This level of output voltage will allow a closed loop pedestal power to be established. A maximum power of 31 dBm occurs at a voltage lower than 1.5V. As a result, the dual FET detector 24 (FIG. 9) is able to comply with the common mode range of the operational amplifiers of a PA controller. Moreover, the dual FET detector 24 has a 40 dB dynamic range while being approximately linear. Further still, the dual FET detector 24 is much more power efficient than a typical logarithmic detector, which draws on the order of 10 mA of current in a lower power mode. In contrast, the dual FET detector 24 draws only around 30 μA of current in a low power mode.

Figure 12:
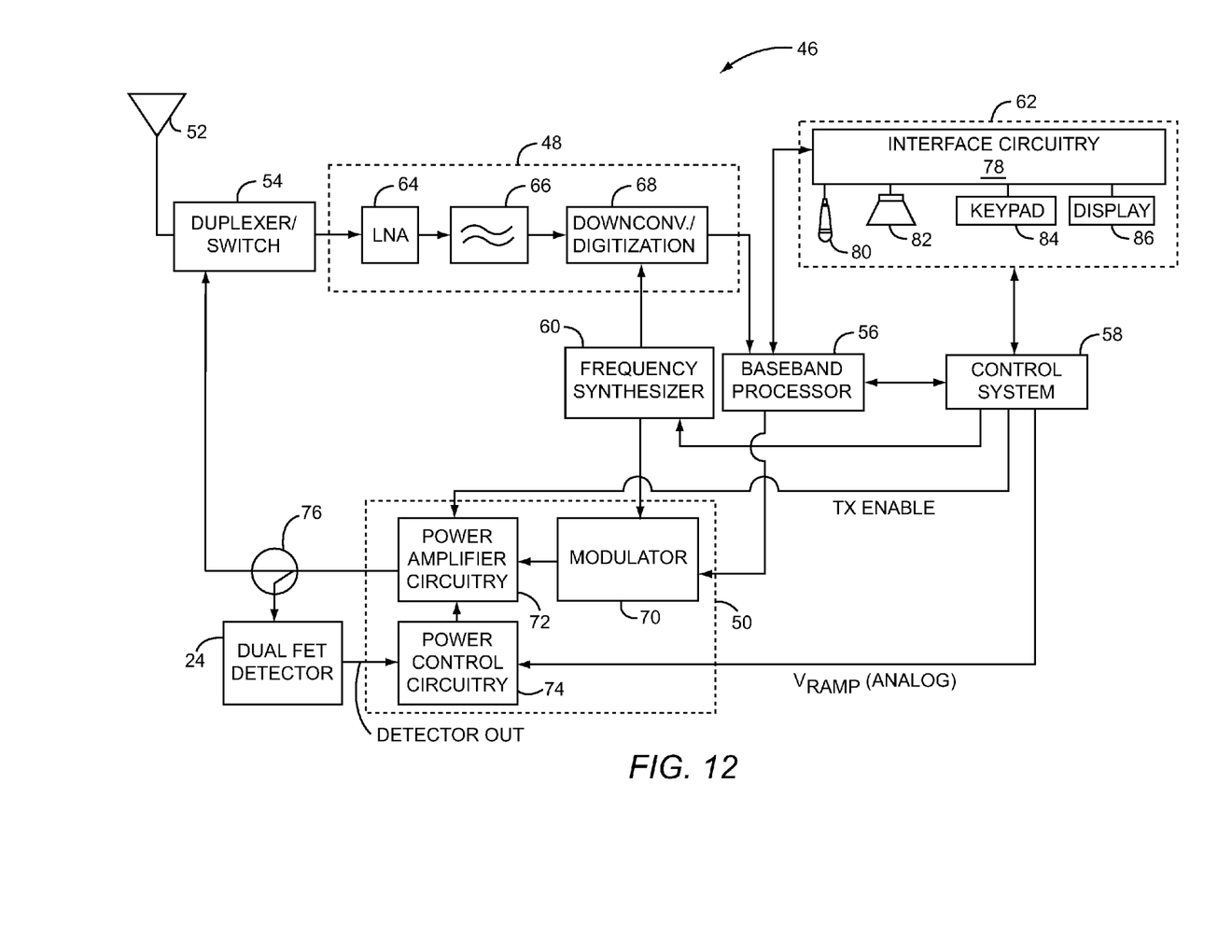
FIG. 12 is a block diagram of a mobile terminal having a dual FET according to the present disclosure.

The dual FET detector 24 of the present disclosure is preferably incorporated in a mobile terminal 46, such as a mobile telephone, personal digital assistant (PDA), personal computer, or the like. The basic architecture of a mobile terminal 46 is represented in FIG. 12, and may include a receiver front end 48, an RF transmitter section 50, an antenna 52, a duplexer or switch 54, a baseband processor 56, a control system 58, a frequency synthesizer 60, and an interface 62.

The receiver front end 48 receives information bearing RF signals from one or more remote transmitters provided by a base station. A low noise amplifier 64 amplifies an RF signal captured by the antenna 52. A filter circuit 66 minimizes broadband interference in the received RF signal, while a downconverter 68 downconverts the filtered, received RF signal to an intermediate or baseband frequency signal, which is then digitized into one or more digital streams. The receiver front end 48 typically uses one or more mixing frequencies generated by the frequency synthesizer 60.

The baseband processor 56 processes the digitized received signal to extract the information or data bits conveyed in the received signal. This processing typically comprises demodulation, decoding, and error correction operations. As such, the baseband processor 56 is generally implemented in one or more digital signal processors (DSPs).

On the transmit side, the baseband processor 56 receives digitized data from the control system 58, which it encodes for transmission. The encoded data is output to the radio frequency transmitter section 50, where it is used by a modulator 70 to modulate a carrier signal that is at a desired transmit frequency. PA circuitry 72 amplifies the modulated carrier signal to a level appropriate for transmission from the antenna 52. The PA circuitry 72 provides gain for the signal to be transmitted under control of power control circuitry 74, which is preferably controlled by the control system 58 using an adjustable power control signal ($V_{RAMP}$). Further still, a directional coupler 76 samples output power from the PA circuitry 72 and provides a small sample of the output power to the dual FET detector 24, which in turn provides the DETECTOR OUT signal to the power control circuitry 74. The directional coupler 76 provides around 15 dB of coupling for transmitter high band (HB) frequencies and around 17 dB of coupling for transmitter low band (LB) frequencies.

As a result of providing the DETECTOR OUT signal from the dual FET detector 24 to the power control circuitry 74, the bias for the PA circuitry 72 is adjusted to maintain a desired output power under varying conditions, such as decreasing battery voltage and/or fluctuating voltage standing wave ratio (VSWR), etc. The control system 58 may also provide a transmit enable signal (TX ENABLE) to effectively enable the PA circuitry 72 during periods of transmission.

A user may interact with the mobile terminal 46 via the interface 62, which may include interface circuitry 78 associated with a microphone 80, a speaker 82, a keypad 84, and a display 86. The interface circuitry 78 typically includes analog-to-digital converters, digital-to-analog converters, amplifiers, and the like. Additionally, the interface circuitry 78 may include a voice encoder/decoder, in which case it may communicate directly with the baseband processor 56.

The microphone 80 will typically convert audio input, such as the user's voice, into an electrical signal, which is then digitized and passed directly or indirectly to the baseband processor 56. Audio information encoded in the received signal is recovered by the baseband processor 56 and converted into an analog signal suitable for driving the speaker 82 and the interface circuitry 78. The keypad 84 and the display 86 enable the user to interact with the mobile terminal 46, inputting numbers to be dialed, address book information, or the like, as well as monitoring call progress information.

Those skilled in the art will recognize improvements and modifications to the preferred embodiments of the present disclosure. All such improvements and modifications are considered within the scope of the concepts disclosed herein and the claims that follow.

What is claimed is:

1. A detection circuit comprising:
a first detector circuit adapted to receive a sample of output power from a power amplifier (PA) of a transmitter and generate a first signal having a magnitude that is proportional to low to medium levels of output power of the PA;
a second detector circuit adapted to receive the sample of output power from the PA and generate a second signal having a magnitude that is proportional to medium to high levels of output power of the PA; and
a control circuit adapted to control a continuous transition between urging a predominance of a contribution to a detector output voltage from the first signal to the second signal as the output power of the PA transitions from low to medium levels to medium to high levels, and to control a continuous transition between urging the predominance of the contribution to the detector output voltage from the second signal to the first signal as the output power of the PA transitions from high to medium levels to medium to low levels.

2. The detection circuit of claim 1 wherein the detection circuit is realized in complementary oxide semiconductor (CMOS) technology.

3. The detection circuit of claim 1 wherein the first detector circuit is an active field effect transistor (FET) detector constructed from a current mirror circuit that provides a bias current to the second detector circuit.

4. The detection circuit of claim 3 wherein the control circuit includes temperature compensation circuitry to maintain stability of the bias current to the second detector circuit during ambient temperature fluctuations.

5. The detection circuit of claim 1 wherein the second detector circuit is a passive RF detector.

6. The detection circuit of claim 1 wherein the first detector circuit and the second detector circuit have a common RF input and a common detector output.

7. The detection circuit of claim 1 wherein the control circuit reduces a current making up the first signal provided by the first detector circuit to the second detector circuit as the output power of the PA transitions from low to medium levels to medium to high levels.

8. The detection circuit of claim 1 wherein the control circuit allows a current making up the first signal provided by the first detector circuit to increase through the second detector circuit to charge an output capacitor with the detector output voltage as the output power of the PA transitions from high to medium levels to medium to low levels.

9. The detection circuit of claim 1 wherein the detector output voltage is at least 20 mV for a PA output power of −5 dBm.

10. The detection circuit of claim 1 wherein the detection circuit provides a dynamic range of 40 dB.

11. A mobile terminal comprising:
a power amplifier (PA) having an output and a control input;
a directional coupler having an input and an output, wherein the input of the directional coupler is communicatively coupled to the output of the PA;
a detection circuit comprising:
a first detector circuit adapted to receive a sample of output power from a power amplifier (PA) and generate a first signal having a magnitude that is proportional to low to medium levels of output power of the PA;
a second detector circuit adapted to receive the sample of output power from the PA and generate a second signal having a magnitude that is proportional to medium to high levels of output power of the PA;
a first control circuit adapted to control a continuous transition between urging a predominance of a contribution to a detector output voltage from the first signal to the second signal as the output power of the PA transitions from low to medium levels to medium to high levels, and to control a continuous transition between urging the predominance of the contribution to the detector output voltage from the second signal to the first signal as the output power of the PA transitions from high to medium levels to medium to low levels; and
a second control circuit having an input and output, wherein the input of the second control circuit receives the detector output voltage and the output of the second control circuit is communicatively coupled to the control input of the PA.

12. The mobile terminal of claim 11 wherein the detection circuit is realized in complementary oxide semiconductor (CMOS) technology.

13. The mobile terminal of claim 11 wherein the first detector circuit is an active FET detector constructed from a current mirror circuit that provides a bias current to the second detector circuit.

14. The mobile terminal of claim 13 wherein the first control circuit includes temperature compensation circuitry to maintain stability of the bias current to the second detector circuit during ambient temperature fluctuations.

15. The mobile terminal of claim 11 wherein the second detector circuit is a passive RF detector.

16. The mobile terminal of claim 11 wherein the first detector circuit and the second detector circuit have a common RF input and a common detector output.

17. The mobile terminal of claim 11 wherein the first control circuit reduces a current making up the first signal provided by the first detector circuit to the second detector circuit as the output power of the PA transitions from low to medium levels to medium to high levels.

18. The mobile terminal of claim 11 wherein the first control circuit allows a current making up the first signal provided by the first detector circuit to increase through the second detector circuit to charge an output capacitor with the detector output voltage as the output power of the PA transitions from high to medium levels to medium to low levels.

19. The mobile terminal of claim 11 wherein the detector output voltage is at least 20 mV for a PA output power of −5 dBm.

20. The mobile terminal of claim 11 wherein the detection circuit provides a dynamic range of 40 dB.

* * * * *